US008921216B2

(12) United States Patent
Lee et al.

(10) Patent No.: US 8,921,216 B2
(45) Date of Patent: Dec. 30, 2014

(54) SEMICONDUCTOR DEVICE AND METHOD OF FABRICATING THE SAME

(71) Applicant: SK Hynix Inc., Gyeonggi-do (KR)

(72) Inventors: Hyo-Seok Lee, Gyeonggi-do (KR); Seung-Jin Yeom, Gyeonggi-do (KR); Sung-Won Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 44 days.

(21) Appl. No.: 13/717,062

(22) Filed: Dec. 17, 2012

(65) Prior Publication Data
US 2014/0021553 A1    Jan. 23, 2014

(30) Foreign Application Priority Data

Jul. 19, 2012  (KR) .................. 10-2012-0078810
Oct. 10, 2012  (KR) .................. 10-2012-0112479

(51) Int. Cl.
*H01L 21/3205*   (2006.01)
*H01L 21/4763*   (2006.01)
*H01L 27/088*    (2006.01)
*H01L 21/28*     (2006.01)
*H01L 27/02*     (2006.01)

(52) U.S. Cl.
CPC ........ *H01L 27/088* (2013.01); *H01L 21/28008* (2013.01); *H01L 27/0207* (2013.01)
USPC ................. 438/585; 257/E21.209; 257/E29.3

(58) Field of Classification Search
CPC .................... H01L 21/28008; H01L 27/088
USPC ...................... 438/585; 257/E21.209, E29.3
See application file for complete search history.

(56) References Cited

U.S. PATENT DOCUMENTS

| 7,180,142 | B2 | 2/2007 | Kishiro |
| 7,772,641 | B2 * | 8/2010 | Omura et al. ................. 257/330 |
| 7,867,829 | B2 * | 1/2011 | Hori .............................. 438/127 |
| 7,875,921 | B2 | 1/2011 | Choi et al. |

* cited by examiner

*Primary Examiner* — David S Blum
(74) *Attorney, Agent, or Firm* — IP & T Group LLP (57) ABSTRACT

A method for fabricating a semiconductor device includes defining a curved active region by forming a plurality of trenches over a semiconductor substrate, forming an insulating layer to fill the plurality of trenches, and forming a pair of gate lines crossing the curved active region, so that it is possible to prevent leaning of an active region by forming a curved active region.

13 Claims, 8 Drawing Sheets

SEMICONDUCTOR DEVICE AND METHOD OF FABRICATING THE SAME

CROSS-REFERENCES TO RELATED APPLICATIONS

The present application claims priority of Korean Patent Application Nos. 10-2012-0078810 and 10-2012-0112479, filed on Jul. 19, 2012 and Oct. 10, 2012, respectively, which are incorporated herein by reference in their entirety.

BACKGROUND

1. Field

Embodiments of the present invention relate to a method of fabricating a semiconductor device, and more particularly, an active region, a memory cell based on the active region, and a method of fabricating the same.

2. Description of the Related Art

A Shallow Trench Isolation (STI) process has been applied as a method of separating a semiconductor device from an adjacent device. The STI process is a process of electrically separating devices by etching the other regions except for a portion where a semiconductor device is formed, and filling the regions with an insulating layer. The active region where the semiconductor device is formed in the STI process has, for example, a bar shape of '-'.

However, as the design rule of semiconductor devices continuously reduces, several concerns due to a short channel effect may be caused. As the line width of the active regions reduces, adjacent active regions may stick to each other due to leaning of the active regions.

SUMMARY

Exemplary embodiments of the present invention are directed to provide a semiconductor device which is capable of preventing an active region from being leaning, and a method of fabricating the semiconductor device.

In accordance with an embodiment of the present invention, a method of fabricating a semiconductor device includes defining a curved active region by forming a plurality of trenches over a semiconductor substrate; forming an insulating layer to fill the plurality of trenches; and forming a pair of gate lines crossing the curved active region.

In accordance with another embodiment of the present invention, a method of fabricating a semiconductor device include forming a first trench having a major axis and a minor axis over a semiconductor substrate; forming a first insulating layer to fill the first trench; forming a second trench connecting adjacent first trenches in the minor axis direction by etching the semiconductor substrate; defining a curved active area defined by the first and second trenches by filling the second trench with a second insulating layer; and forming a pair of gate lines crossing the curved active region.

In accordance with still another embodiment of the present invention, a semiconductor device includes a curved active region defined by a plurality of trenches formed over a semiconductor substrate; an insulating layer to fill the plurality of trenches; and a pair of gate lines crossing the curved active region.

In accordance with still another embodiment of the present invention, a method of fabricating a semiconductor device includes forming first trenches over a semiconductor substrate; and forming second trenches over the semiconductor substrate, wherein curved active regions are defined by using the first and second trenches.

DETAILED DESCRIPTION

Exemplary embodiments of the present invention will be described below in more detail with reference to the accompanying drawings. Only portions needed to understand an operation in accordance with exemplary embodiments of the present invention will be described in the following description. It is to be noted that descriptions of other portions will be omitted so as not to make the subject matters of the present invention obscure.

Exemplary embodiments of the present invention will be described below in more detail with reference to the accompanying drawings such that those skilled in the art can easily achieve the present invention.

Figure 1:
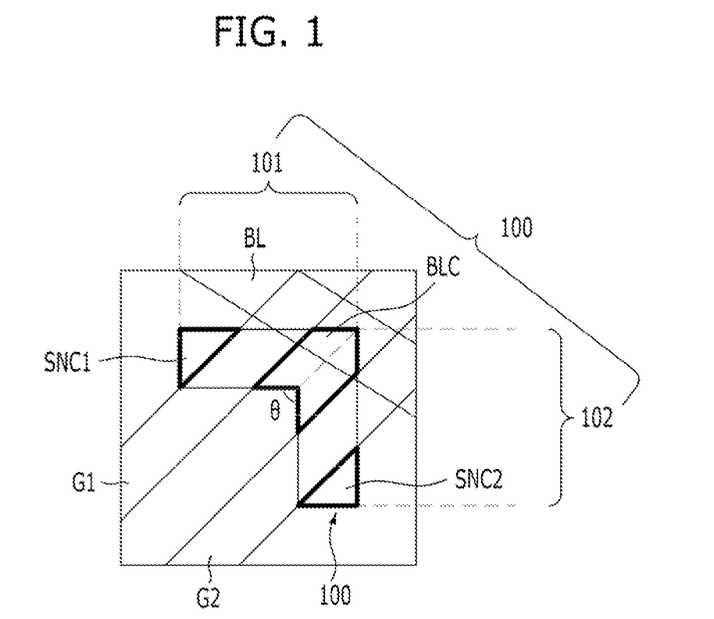
FIG. 1 is a plan view illustrating a semiconductor device in accordance with an embodiment.

FIG. 1 is a plan view illustrating a semiconductor device in accordance with an embodiment.

As illustrated in FIG. 1, one active region 100 includes a first region 101 and a second region 102. The first region 101 that a first gate line passes G1 and a second region 102 that a second gate line G2 passes intersect with each other and an angle is made between the first region 101 and the second region 102. The active region includes a source region and a drain region. The source region is formed in a common region of the first region 101 for forming a first transistor and the second region 102 for forming a second transistor. In the source region, a bit line contact BLC is formed. The drain region includes a first storage node contact SNC1 formed in the first region 101 and a second storage node contact SNC2 formed in the second region 102.

The interior angle θ defined by the first region 101 and the second region 102 that intersect with each other may be 1° to 179° and the bit line contact BLC connected with a bit line may be formed in the common region where the first region 101 and the second region 102 intersect with each other.

Further, the first storage node contact SNC1 and the second storage node contact SNC2 for connection with capacitors are formed at the ends of the first region 101 and the second region 102, respectively.

Consequently, two parallel gate lines G1 and G2 and the bit line BL disposed such that the first and second gate lines G1 and G2 intersect with each other, pass one curved active region 100. Each of the active regions 100 is defined by an isolation layer.

As described above, when the curved active region 100 with an internal angle defined by the first region and the second region intersecting with each other, the first region and the second region support each other, so that inclining or leaning of the active region can be prevented.

Figure 2:
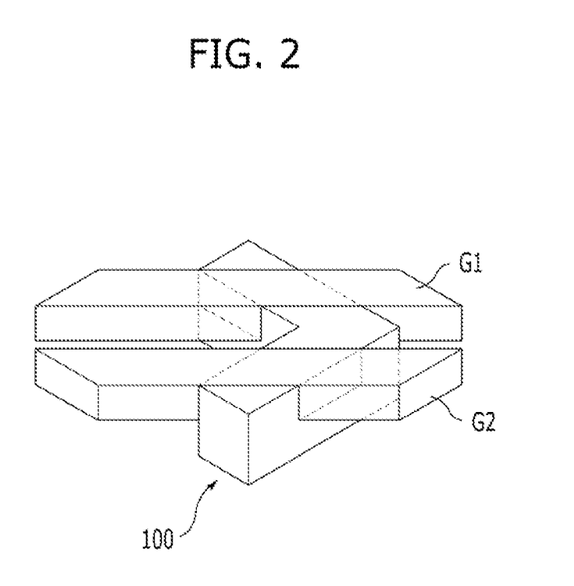
FIG. 2 perspective view briefly illustrating the semiconductor device illustrated in FIG. 1.

FIG. 2 is a perspective view briefly illustrating the semiconductor device illustrated in FIG. 1.

Referring to FIG. 2, one curved active region 100 is formed and two parallel gate lines G1 and G2 pass the active region 100. The gate lines G1 and G2 may be buried gates, as illustrated in the figure, and may be applied to all of gate structures such as a planar type, a fin type, and a recess type, other than the buried gate.

Further, the semiconductor device is briefly illustrated in FIG. 1 for the convenience of description, but a bit line contact connected with a bit line may be formed in the active region between the gate lines G1 and G2, and storage node contacts respectively connected with capacitors may be formed at both ends of the active region 100.

As described above, when the curved active region 100 with an internal angle defined by the first region and the second region intersecting with each other, the first region and the second region support each other, so that inclining or leaning of the active region can be prevented.

Figure 3A:
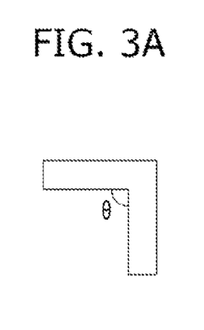
FIGS. 3A to 3C are plan views illustrating examples of an active region in accordance with an embodiment.
Figure 3B:
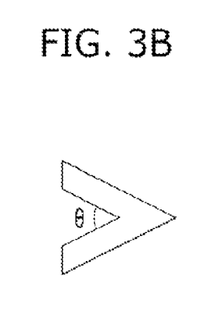
Figure 3C:
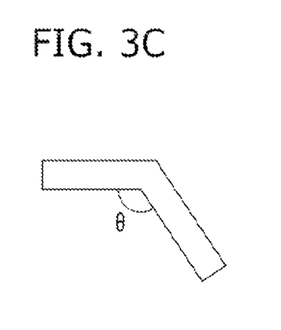

FIGS. 3A to 3C are plan views illustrating examples of an active region in accordance with an embodiment.

As illustrated in FIGS. 3A to 3C, an internal angle θ of a curved active region is set to be able to prevent inclining or leaning of the active region, and the active area may have a internal angle of 90° as shown in FIG. 3A, may have an internal angle smaller than 90° as shown in FIG. 3B, or may have an internal angle larger than 90° as shown in FIG. 3C. The internal angle θ of an active region can be adjusted within a range where two gate lines can pass one active region.

It is assumed in the embodiment that an internal angle of an active region is 90° for the convenience of description.

Figure 4:
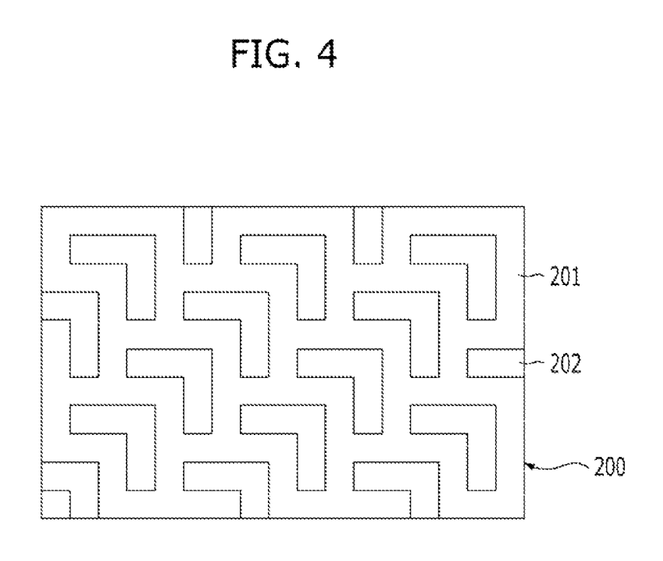
FIG. 4 is an arrangement view of active regions in accordance with an embodiment.

FIG. 4 is an arrangement view of active regions in accordance with an embodiment.

As illustrated in FIG. 4, active regions 202 with a curve are formed on a semiconductor substrate 200. The active regions 202 are defined by an isolation layer 201. The isolation layer 201 may be formed by a Shallow Trench Isolation (STI) process.

The active region 202, as illustrated in FIG. 3, may have an internal angle of 1° to 179° and the bending corner of the active region may be arranged in the direction of 0° to 359.9°. Further, the active regions 202 may be formed to be repeated in the same corner direction or may be arranged in various different directions from the adjacent active regions 202.

For the convenience of description, it is assumed in the embodiment that the active regions having the same shape and the same corner direction are repeated.

Figure 5:
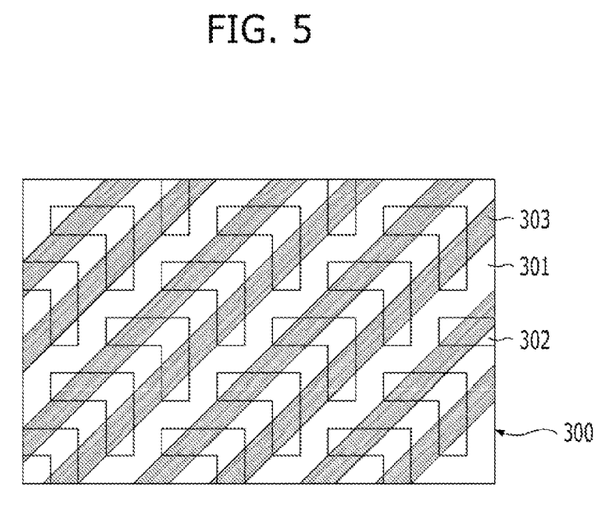
FIG. 5 is an arrangement view of gate lines in accordance with an embodiment.

FIG. 5 is an arrangement view of gate lines in accordance with an embodiment.

As illustrated in FIG. 5, active regions 302 with a curve are formed on a semiconductor substrate 300. The active regions 302 are each defined by an isolation layer 301. The isolation layer 301 may be formed by a Shallow Trench Isolation (STI) process.

Further, two of gate lines 303 pass each of the active regions 302. Two of gate lines 303 simultaneously passing one active region 302 are arranged to extend in parallel.

Figure 6:
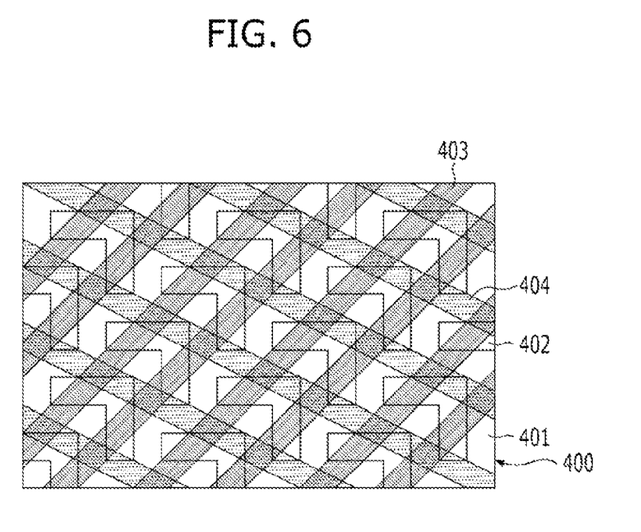
FIG. 6 is an arrangement view of gate lines and bit lines in accordance with an embodiment.

FIG. 6 is an arrangement view of gate lines and bit lines in accordance with an embodiment.

As illustrated in FIG. 6, active regions 402 with a curve are formed on a semiconductor substrate 400. The active regions 402 are each defined by an isolation layer 401. The isolation layer 401 may be formed by an STI process.

Further, two of gate lines 403 pass each of the active regions 402. Two of gate lines 403 simultaneously passing one active region 402 are arranged to extend in parallel.

Further, bit lines 404 passing the curves of the active region 402, that is the common regions between pairs or gate lines 403 simultaneously passing the active regions 402 are disposed. One bit line 404 is disposed to pass one active region 402, intersecting the gate line 403.

FIGS. 7A to 7D are process plan view illustrating a method of fabricating an active region in accordance with a first embodiment.

Figure 7A:
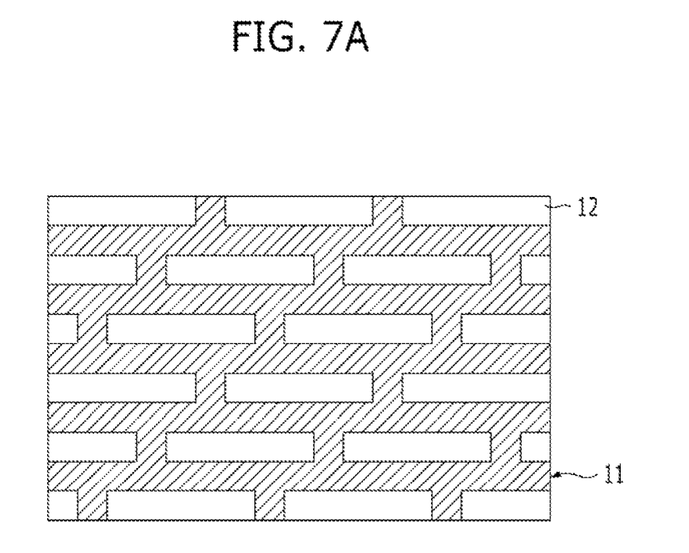
FIGS. 7A to 7D are process plan views illustrating a method of fabricating an active region in accordance with an embodiment.

As illustrated in FIG. 7A a plurality of first trenches 12 with a major axis and a minor axis are formed by etching a semiconductor substrate 11. The semiconductor substrate 11 may include a silicon-containing material. The semiconductor substrate 11 may include a monocrystal silicon substrate.

In order to form the first trenches 12, a process of forming a mask pattern (not illustrated) on the semiconductor substrate 11 and then etching the semiconductor substrate 11 with the mask pattern as an etching barrier. The mask pattern (not illustrated) may be formed by coating a photosensitive layer and patterning it by exposure and development. In particular, one single layer selected from a group of a buffer layer, a hard mask, and an Anti Reflection Coating (ARC), or a stacked layer of them may be additionally form on the semiconductor layer 11, before the mask pattern (not illustrated) is formed.

Reference number '11A' indicates a semiconductor substrate patterned by the first trenches 12.

Figure 7B:
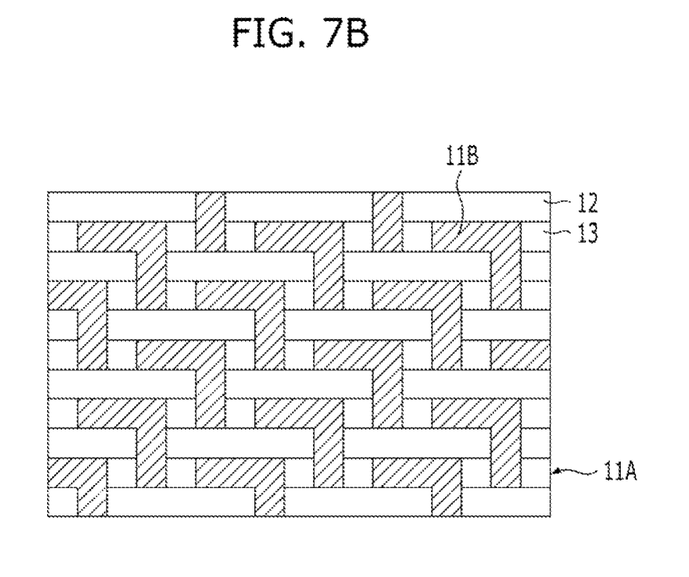

As illustrated in FIG. 7B, a plurality of second trenches 13 connecting the adjacent first trenches 12 in the minor axis direction are formed by patterning the semiconductor substrate 11A. A plurality of curved active regions 11B are defined by the adjacent first trenches 12 connected in the minor axis direction by the second trenches 13.

In order to form the second trenches 13, a process of forming a mask pattern (not illustrated) that opens a second trench region on the semiconductor substrate 11A including the first trenches 12, and etching the semiconductor substrate 11A with the mask pattern (not illustrated) as an etching barrier may be performed.

A protection layer may be buried to prevent attach of the first trenches 12 before the second trenches 13 are formed, and may be removed with the mask pattern (not illustrated) after the second trenches 13 is formed, or may be removed by a protection layer removal process after the mask pattern is removed.

Figure 7C:
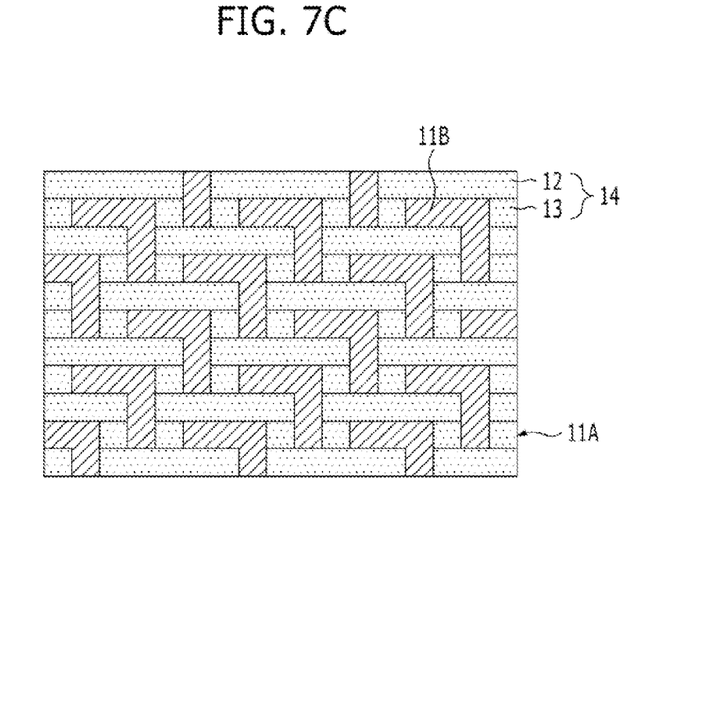

As illustrated in FIG. 7C, an insulating layer 14 is buried in the first trenches 12 and the second trenches 13. The insulating layer 14 may include an oxide layer. The insulating layer 14 is provided to form an isolation layer for defining an active region, and hereafter, the insulating layer 14 buried in the first and second trenches 12 and 13 is referred to as an 'isolation layer 14'.

Figure 7D:
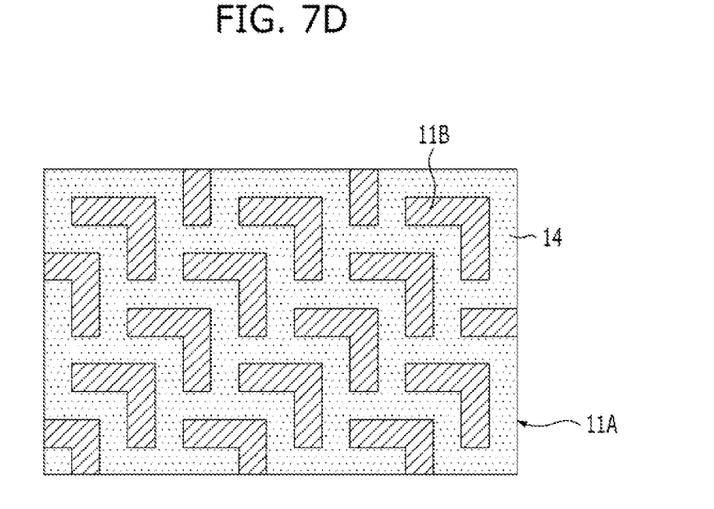

As a result, as illustrated in FIG. 7D, the curved active regions 11B defined by the isolation layer 14 formed through the first and second trenches are formed.

FIGS. 8A to 8E are process plan views illustrating a method of fabricating an active region in accordance with another embodiment.

Figure 8A:
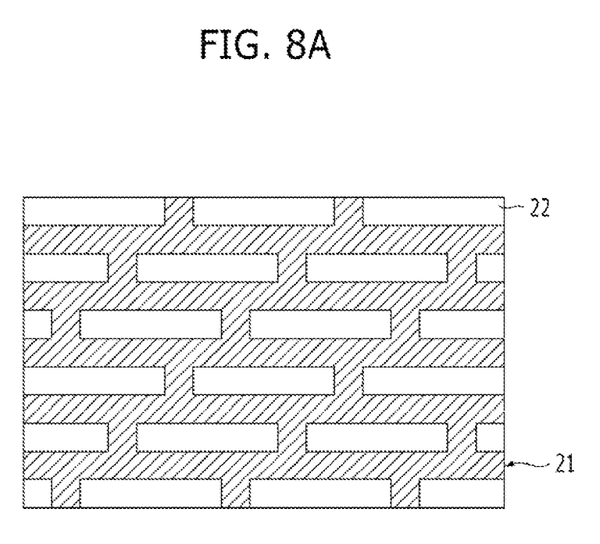
FIGS. 8A to 8E are process plan views illustrating a method of fabricating an active region in accordance with another embodiment.

As illustrated in FIG. 8A, a plurality of first trenches 22 with a major axis and a minor axis are formed by etching a semiconductor substrate 21. The semiconductor substrate 21 may include a silicon-containing material. The semiconductor substrate 21 may include a monocrystal silicon substrate.

In order to form the first trenches 22, a process of forming a mask pattern (not illustrated) on the semiconductor substrate 21 and then etching the semiconductor substrate 21 with the mask pattern as an etching barrier. The mask pattern (not illustrated) may be formed by coating a photosensitive layer and pattering it by exposure and development. In particular, one single layer selected from a group of a buffer layer, a hard mask, and an ARC, or a stacked layer of them may be additionally form on the semiconductor layer 21, before the mask pattern (not illustrated) is formed.

Reference number '21A' indicates a semiconductor substrate patterned by the first trenches 22.

Figure 8B:
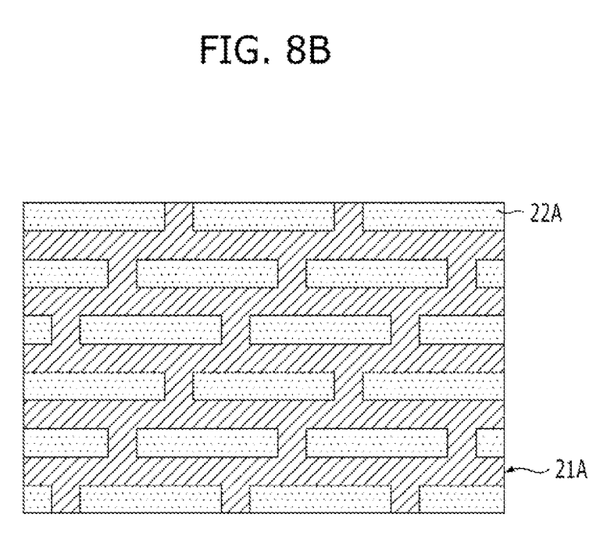

As illustrated in FIG. 8B, an insulating layer is buried in the first trenches 22. The insulating layer may include an oxide layer. The insulating layer buried in the first trenches 22 is referred to as a 'first isolation layer 22A'.

Figure 8C:
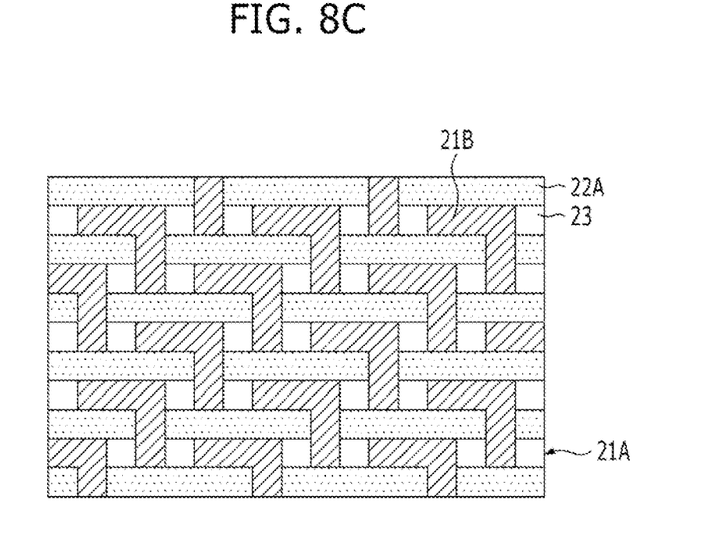

As illustrated in FIG. 8C, a plurality of second trenches 23 connecting the adjacent first isolation layers 22A in the minor axis direction are formed by patterning the semiconductor substrate 21A. A plurality of curved active regions 21B are defined by the adjacent isolation layers 22 connected in the minor axis direction by the second trenches 23.

In order to form the second trenches 23, a process of forming a mask pattern (not illustrated) that opens a second trench region on the semiconductor substrate 21A including the first isolation layer 22A, and etching the semiconductor substrate 21A with the mask pattern (not illustrated) as an etching barrier may be performed.

Figure 8D:
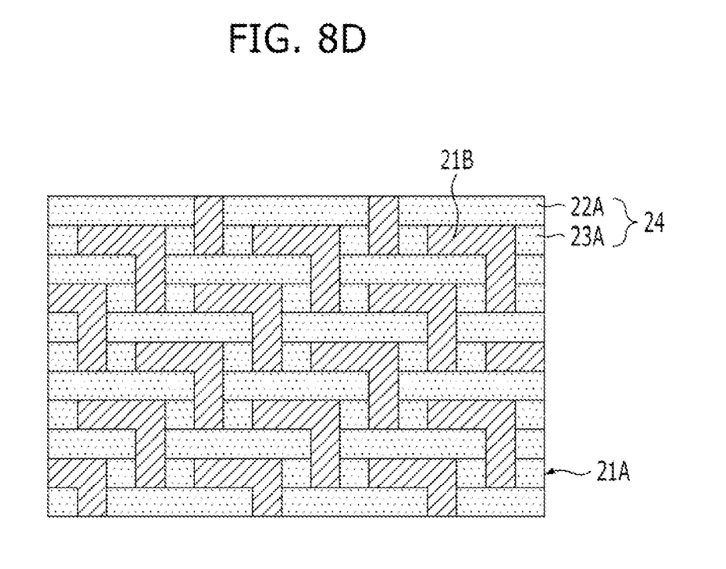

As illustrated in FIG. 8D, an insulating layer is buried in the second trenches 23. The insulating layer may include an oxide layer. The insulating layer buried in the second trenches 23 is referred to as a 'second isolation layer 23A'. The first and second isolation layers 22A and 23A are provided to define the curved active regions 21B, and referred to as an 'isolation layer 24'.

Figure 8E:
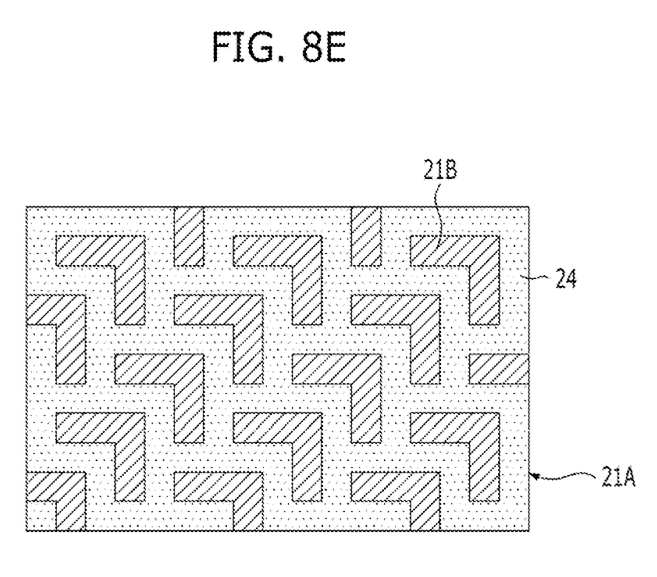

As a result, as illustrated in FIG. 8E, the curved active regions 21B defined by the isolation layer 24 formed through the first and second trenches are formed.

Although it is assumed in the embodiment that the internal angle is 90° for the convenience of description, the curve active regions 21B may have an internal angle of 1° to 179° and the curved corner of the active region may be arranged in the direction of θ to 359.9°. The curve active regions 21B may be formed to be repeated in the same corner direction or may be disposed in various directions different from the adjacent curve active regions 21B.

While the present invention has been described with respect to the specific embodiments, it should be noted that the embodiments are for describing, not limiting, the present invention. Further, it should be noted that the present invention may be achieved in various ways by those skilled in the art without departing from the scope of the present invention.

According to the embodiments of the present invention it is possible to prevent leaning of an active region by forming an active region with a curve.

While the present invention has been described with respect to the specific embodiments, it will be apparent to those skilled in the art that various changes and modifications may be made without departing from the spirit and scope of the invention. Accordingly, the scope of the invention is not limited to exemplary embodiments as described above and is defined by the following claims and equivalents to the scope the claims.

What is claimed is:

1. A method of fabricating a semiconductor device, comprising:
    defining a curved active region by forming a plurality of trenches over a semiconductor substrate;
    forming an insulating layer to fill the plurality of trenches; and
    forming a pair of gate lines crossing the curved active region,
    wherein the curved active region includes a first region which protrudes toward a first direction and a second region which is in contact with the first region and protrudes toward a second direction crossing the first direction, and
    wherein one of the pair of gate lines crosses the first region, the other of the pair of gate lines crosses the second region, and the pair of gate lines extend along a third direction crossing the first and second directions.

2. The method of claim 1, wherein the defining of the curved active region comprises:
    forming a first trench having a major axis and a minor axis by etching the semiconductor substrate; and
    forming a second trench by etching the semiconductor substrate such that the second trench is coupled to adjacent first trenches in the minor axis direction of the first trench.

3. The method of claim 1, wherein the pair of gate lines are spaced with a gap in parallel with each other.

4. The method of claim 1, further comprising:
    forming a bit line that is in contact with the curved active region and extends to intersect the pair of gate lines.

5. The method of claim 1, wherein the curved active region has an internal angle of 1° to 179°.

6. The method of claim 1, wherein the curved active region includes at least one curve.

7. The method of claim 1, wherein the gate line includes a buried gate line.

8. A method of fabricating a semiconductor device, comprising:
    forming a first trench having a major axis and a minor axis over a semiconductor substrate;
    forming a first insulating layer to fill the first trench;
    forming a second trench connecting adjacent first trenches in the minor axis direction by etching the semiconductor substrate;
    defining a curved active area defined by the first and second trenches by filling the second trench with a second insulating layer; and
    forming a pair of gate lines crossing the curved active region.

9. The method of claim 8, wherein the pair of gate lines are spaced with a gap in parallel with each other.

10. The method of claim 8, further comprising:
    forming a bit line that is in contact with the curved active region and extends to intersect the pair of gate lines.

11. The method of claim 8, wherein the curved active region has an internal angle of 1° to 179°.

12. A method of fabricating a semiconductor device, comprising:
    forming first trenches over a semiconductor substrate; and
    forming second trenches over the semiconductor substrate, wherein curved active regions are defined by using the first and second trenches.

13. The method of claim 12, further comprising:
    forming an insulating layer to fill the first and second trenches; and
    forming a pair of gate lines crossing one of the curved active regions.

* * * * *